United States Patent [19]

Bonü

[11] 4,350,562
[45] Sep. 21, 1982

[54] METHOD FOR ETCHING SEMICONDUCTOR WAFERS ON ONE SIDE

[75] Inventor: Bonü Bonü, Munich, Fed. Rep. of Germany

[73] Assignee: Siemens Aktiengesellschaft, Berlin and Munich, Fed. Rep. of Germany

[21] Appl. No.: 274,883

[22] Filed: Jun. 18, 1981

[30] Foreign Application Priority Data

Jul. 23, 1980 [DE] Fed. Rep. of Germany ....... 3027934

[51] Int. Cl.³ .......................................... H01L 21/306
[52] U.S. Cl. .................... 156/639; 156/345; 156/640; 156/642; 156/662
[58] Field of Search .................. 156/345, 636–640, 156/662, 642; 134/33; 269/21

[56] References Cited

U.S. PATENT DOCUMENTS 4,161,356  7/1979  Giffin et al. ................ 156/345 X
4,165,252  8/1979  Gibbs ........................... 156/345 X Primary Examiner—William A. Powell
Attorney, Agent, or Firm—Herbert L. Lerner; Laurence A. Greenberg

[57] ABSTRACT

Etching a semiconductor wafer on one side by suspending the wafer on a rotating gas cushion with the wafer surface not to be etched facing the gas cushion with the other wafer surface exposed for etching. The exposed surface is sprayed with etchant and centrifuged at the same time. Subsequently, the etched surface is sprayed with rinsing agent and then centrifuged dry.

7 Claims, 3 Drawing Figures

METHOD FOR ETCHING SEMICONDUCTOR WAFERS ON ONE SIDE

BACKGROUND OF THE INVENTION

1. Field of the Invention

This invention relates to etching semiconductor wafers on one side and more particularly, refers to a new and improved method of etching semiconductor wafers on one side without covering the other side with a varnish or similar coating.

2. Description of the Prior Art

When processing semiconductor materials into certain components there is often the need to etch one circular surface of a semiconductor wafer only while the etchant must be kept away from the opposite surface of the semiconductor wafer.

According to the commonly applied etching methods, the semiconductor surface not to be etched must be covered with a varnish for this purpose. This varnish must be dried by heating, whereupon the second, uncoated semiconductor wafer can be etched. This requires expensive operations such as rinsing and drying of the wafers, and finally the varnish on the reverse side must be removed, again requiring rinsing and drying operations after removal of the varnish. Since all these operations are usually performed by arranging several semiconductor wafers in a group, each individual operation requires a regrouping. To etch semiconductor wafers on one side requires approximately twenty process steps to be carried out, consuming much labor at considerable cost. Moreover, the need of deionized water to rinse the semiconductor wafers and the consumption of chemicals and energy are quite substantial.

In addition, damage in the form of contamination is often caused on the varnished semiconductor surface, because sometimes varnish residues are not removed completely, or else scratches or fractures are caused on the treated semiconductor wafer in consequence of the many individual operations to which the semiconductor wafer is subjected.

SUMMARY OF THE INVENTION

Accordingly, it is an object of the present invention to provide a method for etching one side of semiconductor wafers assuring, on the one hand, that the semiconductor wafers to be treated remain undamaged and reducing, on the other hand, the labor cost and the consumption of deionized water, chemicals, and energy.

With the foregoing and other objects in view, there is provided in accordance with the invention a method for etching semiconductor wafers on one side, which comprises suspending a semiconductor wafer to be etched on a rotating gas cushion with the semiconductor wafer surface not to be etched facing the rotating gas cushion while the semiconductor wafer surface to be etched is free, and spraying the free semiconductor surface with etchant and centrifuging at the same time because of rotation of the wafer in contact with the rotating gas cushion.

In accordance with the invention, there is provided a method wherein the rotating gas cushion is generated by means of a turntable which contains an axial gas supply line through which gas flows; said turntable having at its outside diameter several stop brackets to hold the semiconductor wafer, said turntable with its stop brackets and flow of gas through said axial supply line when the arrangement is in operation providing a rotating gas cushion between the turntable and the semiconductor wafer so that the semiconductor wafer does not touch the turntable; at least one spraying device to spray the semiconductor surface facing away from the rotating gas cushion; and a collecting device for the used spray liquid.

Although the invention is illustrated and described herein as embodied in a method of etching semiconductor wafers on one side, it is nevertheless not intended to be limited to the details shown, since various modifications may be made therein without departing from the spirit of the invention and within the scope and range of equivalents of the claims.

DETAILED DESCRIPTION OF THE INVENTION

The invention, however, together with additional objects and advantages thereof will be best understood from the following description when read in connection with the accompanying drawings, in which:

FIG. 1 diagrammatically shows a turntable in cross section according to the invention, with particular reference to a gas cushion on which a semiconductor wafer is deposited with the surface in contact with the cushion protected and the other surface exposed to etching.

DETAILED DESCRIPTION OF THE INVENTION

In accordance with the invention, the semiconductor wafer to be etched is put into a state of suspension by means of a rotating gas cushion in such manner that the semiconductor wafer surface not to be etched faces the rotating gas cushion while the semiconductor wafer surface to be etched is free. The free semiconductor wafer surface is sprayed with etchant and centrifuged at the same time because of the wafer rotation, and subsequently, the free semiconductor wafer surface is sprayed with a rinsing agent and then centrifuged dry.

The use of a rotating gas cushion according to the invention prevents damage to or contamination of the semiconductor wafer and also eliminates a number of operations, which means a saving of time and material costs.

It is also advantageous to heat the etchant prior to spraying. Heating the etchant before spraying the semiconductor wafer can reduce the etching time.

The preferred materials are silicon as semiconductor material, hydrofluoric acid as etchant and deionized water as rinsing agent. Since mature technologies for the production and processing of silicon semiconductor components are available, it is advantageous to use silicon.

It has proved to be advantageous to use deionized water for the rinsing of silicon semiconductor wafers, since water containing ions on the silicon surface can cause the uncontrolled incorporation of various ions in the wafer, often resulting in a degradation of semiconductor components produced thereby.

It is advantageous to carry out the method according to the invention using a device so designed that the rotating gas cushion is generated by a turntable containing an axial gas supply line, through which a suitable gas flows. The turntable has at its outside diameter several stop brackets to hold the semiconductor wafer. When the device is in operation, a rotating gas cushion forms between the turntable and the semconductor wafer so that the semiconductor wafer does not touch the turntable. One or more spraying devices to spray the semiconductor surface facing away from the rotating gas cushion are provided; and a collecting device for the spent spray is provided.

Through the use of this device the semiconductor wafer is retained sufficiently well to permit etching and keep free from damage.

It is also advantageous to connect to the collecting device a device to heat and pump the liquid back into the spraying device. Pumping the liquid back assures minimal consumption of the liquid used; heating the liquid assures a shorter etching and cleaning time of the treated semiconductor wafer.

Finally, it is advantageous that the semiconductor wafers be transported by means of swiveling suction pincers to load and unload the turntable. This measure makes automation of the loading and unloading operation of the device with semiconductor wafers possible.

The invention is explained below in greater detail by way of the drawings and an embodiment example.

Figure 1:
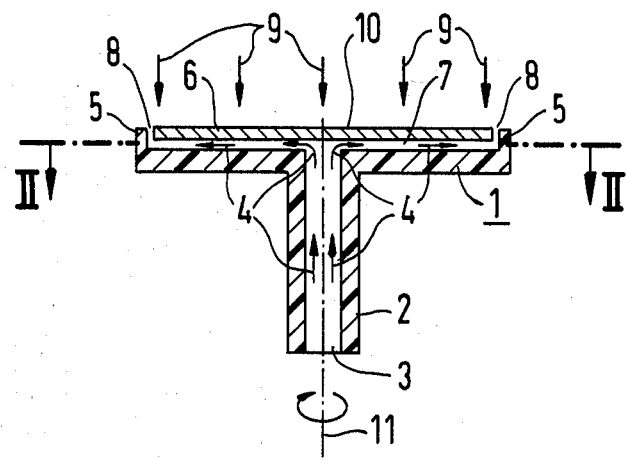

FIG. 1 shows a cross section of a turntable 1 according to the invention, made conveniently of plastic. Turntable 1 has a tube 2 with a hollow shaft, through the interior 3 of which a gas is conducted to form the gas cushion 7. Gases usable to form a gas cushion 7 are air, nitrogen or any other gas which will not react chemically with the wafer material in the low operating temperature ranges. However, the gas must be of high chemical purity and be free of dirt particles and moisture. The arrows 4 indicate the direction of the gas motion filling the gas cushion. The turntable 1 has at its outside rim several stop brackets 5 which not only prevent a semiconductor wafer 6 from sliding off the gas cushion 7 formed between turntable 1 and semiconductor wafer 6 but also serve as driver for the semiconductor wafer 6, thus transmitting the rotary motion of the turntable 1 to the semiconductor wafer 6. The gap 8 remaining between the stop bracket 5 and the outside rim of the semiconductor wafer 6 is very narrow with a magnitude of the order of fractions of a millimeter. The size of this gap 8 depends on the weight of the semiconductor wafer 6 and on the pressure of the gas used. The gas, introduced into the hollow shaft 2, flows through the turntable 1 in the direction of the arrows 4. The gas can escape from the turntable 1 laterally, mainly through those gaps between the turntable 1 and the semiconductor wafer 6 where there is no stop bracket 5. The surface 10 of the semiconductor wafer 6, facing away from the gas cushion 7, is sprayed homogeneously with etchant or rinsing agent, as indicated by the arrow 9. The turntable 1 is set in rotation, the axis of symmetry 11 being the axis of rotation.

Figure 2:
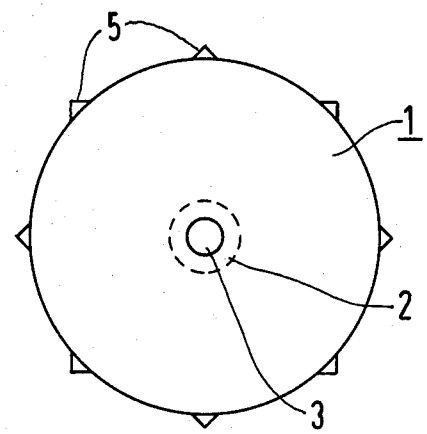
FIG. 2 is a top view of the turntable according to the invention, taken along line II—II of FIG. 1. The arrangement of stop brackets around the wafer is shown.

FIG. 2 represents a top view of the turntable according to FIG. 1, sectioned along line II—II in FIG. 1. The stop brackets 5 are attached to the outside rim of the turntable 1. The reference symbols 3 and 2 designate the same items as in FIG. 1.

Figure 3:
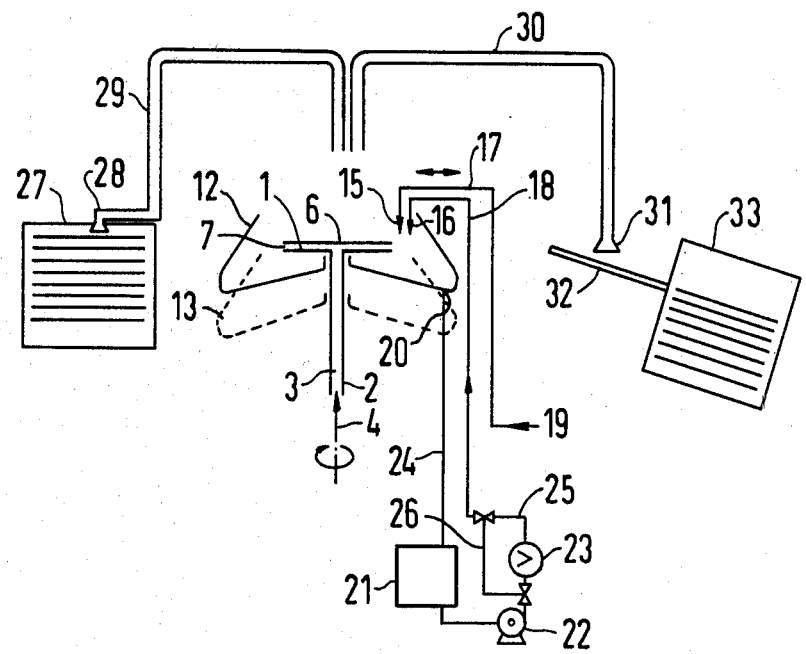
FIG. 3 is a schematic representation of an arrangement for carrying out the method according to the invention for etching semiconductor wafers on one side.

FIG. 3 is a schematic representation of a device for carrying out the method according to the invention.

Identical items in FIGS. 1, 2 and 3 again have the same reference symbols, for which reason items already described in FIGS. 1 and 2 will not be described again.

The surface which faces away from the gas cushion of a semiconductor wafer 6 lying on a turntable 1 and a gas cushion 7 can be sprayed with rinsing water by means of the spray nozzle 15 and with etchant by means of the spray nozzle 16. Due to the gas cushion 7 none of the two liquids can reach the underside of the semiconductor wafer 6 so that one-sided etching of semiconductor wafers is assured by this procedure. The spray nozzles 15 and 16 are mounted so that they can be moved from the position shown in FIG. 3 towards the axis of symmetry of the turntable 1 so that only one of these nipples is fastened above the semiconductor wafer at a time. Disposed below the turntable 1 is a collecting device (catch pan) 12 which can be lowered into the position 13 shown in broken lines to load and unload the turntable 1 with semiconductor wafers. Instead of lowering the catch pan 12 into the position 13 it may also be fixed and the turntable 1 mounted so as to be height-adjustable relative to the catch pan 12. The catch pan 12 has a drainage nipple 20, through which collected etchant can reach a reservoir 12 via the tube 24, from where it can be heated to a desired temperature via a circulating pump 22 and a heater 23, to be pumped back via the tubes 25 and 18 into the spray nozzle 16 to spray new semiconductor wafers 6. If heating of the etchant is not desired or if the heated etchant is to be mixed with unheated etchant, it may also be conducted, coming from the circulating pump 22, to the spray nozzle 16 in toto or in part via the tubes 26 and 18. To rinse semiconductor wafers, deionized water (indicated by the arrow 19) is fed into the supply line 17 and the spray nozzle 15. Two swivel arms 29 and 30, at the end of which suction nipples 28 and 31 are located may be used for automated loading and unloading of the turntable 1 with semiconductor wafers 6. By means of the suction nipple 28 a semiconductor wafer can be lifted out of a cassette 27 by suction and fed to the turntable 1 by means of the swivel arm 29. Analogously, the swivel arm 30 can attach a semiconductor wafer 6 lying on the turntable 1 by means of the suction nipple 31, transfer it to another cassette 33 and possibly load this cassette with finished semiconductor wafers 6, using a chute 32. The method according to the invention can be automated in the manner indicated in FIG. 3.

The method according to the invention can be applied to the manufacture of all semiconductor components or ics (integrated circuits) requiring etching of semiconductor wafers on one side.

I claim:

1. Method for etching semiconductor wafers on one side, which comprises suspending a semiconductor wafer to be etched on a rotating gas cushion with the semiconductor wafer surface not to be etched facing the rotating gas cushion while the semiconductor wafer surface to be etched is free, and spraying the free semiconductor surface with etchant, said wafer in contact with the rotating gas cushion rotating and moving the etchant thereon outward away from the center.

2. Method according to claim 1, wherein the free semiconductor surface is subsequently sprayed with a rinsing agent and then centrifuged dry.

3. Method according to claim 1, wherein the etchant is heated prior to spraying.

4. Method according to claim 1, wherein the semiconductor material is silicon, the etchant is hydrofluoric acid and the rinsing agent is deionized water.

5. Method according to claim 1, wherein the semiconductor wafer is suspended above a turntable by passing an axial gas stream through the turntable to provide said gas cushion between the turntable and the semiconductor wafer, and wherein the suspended wafer is blocked from substantial lateral movement.

6. Method according to claim 5, wherein liquid flowing off the semiconductor wafer is collected and the collected liquid pumped back for spraying the wafer.

7. Method according to claim 5 or claim 6, wherein the wafer is transported from storage by attaching the wafer by suction to a swivel arm and swiveling the arm to deposit the wafer above the turntable, and also transporting the wafer after treatment by suction by a swivel arm to a product site.

* * * * *